(12) United States Patent
Sugawara et al.

(10) Patent No.: US 8,190,277 B2
(45) Date of Patent: May 29, 2012

(54) METHOD FOR LIMITING EXPANSION OF EARTHQUAKE DAMAGE AND SYSTEM FOR LIMITING EXPANSION OF EARTHQUAKE DAMAGE FOR USE IN SEMICONDUCTOR MANUFACTURING APPARATUS

(75) Inventors: Yudo Sugawara, Oshu (JP); Hiroshi Kikuchi, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 742 days.

(21) Appl. No.: 12/292,636

(22) Filed: Nov. 21, 2008

(65) Prior Publication Data
US 2009/0143876 A1 Jun. 4, 2009

(30) Foreign Application Priority Data

Nov. 30, 2007 (JP) ................................ 2007-309720
Oct. 21, 2008 (JP) ................................ 2008-270753

(51) Int. Cl.
*G06F 19/00* (2006.01)
(52) U.S. Cl. ........................... 700/79; 700/108; 700/121
(58) Field of Classification Search .................... 700/79, 700/108, 121
See application file for complete search history.

(56) References Cited

U.S. PATENT DOCUMENTS

| | | | | |
|---|---|---|---|---|
| 5,228,778 | A * | 7/1993 | Nakatani | 374/33 |
| 6,540,469 | B2 * | 4/2003 | Matsunaga et al. | 414/416.08 |
| 6,780,251 | B2 * | 8/2004 | Tometsuka | 118/725 |
| 6,945,258 | B2 * | 9/2005 | Itou | 134/56 R |
| 7,198,447 | B2 * | 4/2007 | Morimitsu et al. | 414/217 |
| 7,346,432 | B2 * | 3/2008 | Matsumiya et al. | 700/275 |
| 7,416,405 | B2 * | 8/2008 | Asari et al. | 432/239 |
| 2002/0037210 | A1 * | 3/2002 | Matsunaga et al. | 414/416.08 |
| 2002/0074635 | A1 * | 6/2002 | Hattori et al. | 257/678 |
| 2002/0124906 | A1 * | 9/2002 | Suzuki et al. | 141/98 |
| 2002/0153027 | A1 * | 10/2002 | Itou | 134/18 |
| 2004/0052618 | A1 * | 3/2004 | Matsunaga et al. | 414/217 |
| 2004/0187451 | A1 * | 9/2004 | Suzuki et al. | 55/385.1 |
| 2006/0137726 | A1 * | 6/2006 | Sano et al. | 134/61 |
| 2007/0144242 | A1 * | 6/2007 | Matsumiya et al. | 73/82 |

FOREIGN PATENT DOCUMENTS

| | | |
|---|---|---|
| JP | 5-293192 | 11/1993 |
| JP | 2000-150400 | 5/2000 |
| JP | 2002-93892 | 3/2002 |
| JP | 2005-533381 | 11/2005 |
| JP | 2008114961 A * | 5/2008 |

OTHER PUBLICATIONS

Japanese Office Action issued on May 24, 2011 for Application No. 2008-270753 with English translation.

* cited by examiner

*Primary Examiner* — Michael D Masinick
(74) *Attorney, Agent, or Firm* — Smith, Gambrell & Russell, LLP

(57) ABSTRACT

To predict occurrence of an earthquake so as to minimize damage by preventing an object to be processed from flying out of an opened container. An emergency earthquake notice, which is delivered based on a preliminary tremor through a communication line, is received by a reception part 28, or a preliminary tremor is directly detected by a preliminary-tremor detection part 60. A control part 29 carries out a first step in which an operation of a semiconductor manufacturing apparatus 1 is stopped based on the emergency earthquake notice received by the reception part 28 or the preliminary tremor detected by the preliminary-tremor detection part 60, and a second step in which, when the door mechanism is being opened, the door mechanism 15 is closed.

4 Claims, 9 Drawing Sheets

METHOD FOR LIMITING EXPANSION OF EARTHQUAKE DAMAGE AND SYSTEM FOR LIMITING EXPANSION OF EARTHQUAKE DAMAGE FOR USE IN SEMICONDUCTOR MANUFACTURING APPARATUS

CROSS REFERENCE TO RELATED APPLICATIONS

This application is based upon and claims the benefit of priority from the prior Japanese Patent Application Nos. 2007-309720 and 2008-270753 filed on Nov. 30, 2007, and Oct. 21, 2008, the entire contents of which are incorporated herein by reference.

FIELD OF THE INVENTION

The present invention relates to a method for limiting expansion of earthquake damage and a system for limiting expansion of earthquake damage for use in a semiconductor manufacturing apparatus.

BACKGROUND ART

The manufacture of semiconductor devices includes steps of providing various processes, such as oxidation, film deposition, and the like, to semiconductor wafers as objects to be processed. As the apparatus for performing these processes, there is employed a semiconductor manufacturing apparatus (also referred to as a vertical heat processing apparatus), for example, which is capable of processing a number of wafers in a batch mode (e.g., see Patent Document 1).

The semiconductor manufacturing apparatus includes: a transfer area including a transfer mechanism configured to transfer a FOUP (Front Opening Unify Pod, also referred to as a carrier), which serves as a container for containing a plurality of wafers, from a loading port (loading and unloading part) to a storage shelf part or a transport part and vice versa; a wafer counter (detection mechanism) configured to detach a detachable lid from a front part of the FOUP that has been loaded into the loading port, and to detect positions of wafers in the FOUP; a FOUP catcher (receiving and sending mechanism) configured to receive the FOUP from the transfer mechanism and to send the FOUP to the transport part; an elevating mechanism disposed in a loading area (working area) formed below a furnace opening of a heating furnace, the elevating mechanism being configured to support a boat (holder), which is capable of vertically holding a plurality of wafers at predetermined intervals, on a lid member for opening and closing the furnace opening, so as to load/unload the boat into/from the heating furnace; a door mechanism configured to open and close an opening formed in a partition wall separating the transfer area and the loading area, together with the lid of the FOUP on the transport part; and a notch aligner (aligning mechanism) configured to receive wafers from the loading area, and to align positions of marks such as notches (cut-outs) provided in the respective peripheries of the wafers.

These wafers are expensive, and thus the production cost will increase as the processing steps advance. Thus, the wafers should be handled with greater care.

[Patent Document 1] JP2000-150400A

However, in the aforementioned semiconductor manufacturing apparatus of a batch type, the construction of the apparatus poses various restrictions in terms of software and hardware, which makes it difficult for the apparatus to have an earthquake resistant construction or an earthquake-proof function. Thus, a sufficient countermeasure against earthquake has not been actually taken. Therefore, when an earthquake occurs and the apparatus experiences a greater shake, the apparatus may suffer various damages. Namely, the boat may fall over and be destroyed, wafers may be leaped out from the boat and broken, and/or a gas may be leaked. If the apparatus suffers such damage, it should take a longer time to make the apparatus recover for restart of the manufacture, which may further increase damage. In order to solve this problem, the Applicant of the present invention filed a method for limiting expansion of earthquake damage and a system for limiting expansion of earthquake damage for use in a semiconductor manufacturing apparatus (Japanese Patent Application No. 2007-208863 which is unpublished).

However, only the invention of the above patent application is insufficient for protecting the overall semiconductor manufacturing apparatus. For example, in the loading port and the transport part, the FOUP is sometimes being opened with its lid being detached therefrom. Under this state, when an earthquake occurs to roughly shake the apparatus, wafers may fly out of the FOUP and the wafers which have flown out of the FOUP may fall and break.

In addition, in a case where an earthquake occurs and the apparatus experiences a greater shake when the FOUP is being transferred by the transfer mechanism, the FOUP may fall over so that the wafers in the FOUP may break. Alternatively, when an earthquake occurs after the FOUP has been placed by the FOUP catcher onto the transport part, the FOUP may fall from the transport part so that the wafers in the FOUP may break.

In addition, in a case where an earthquake occurs when the boat is being unloaded from the heating furnace after the heating process, wafers may fly out of the boat, and the wafers may fall and break. When a wafer breaks into small pieces, and the pieces are then scattered in the loading area, the pieces may get caught in the respective driving parts.

The semiconductor manufacturing apparatus includes: a heater (heating apparatus) configured to heat the heating furnace to a high temperature; a pump system configured to evacuate the heating furnace, and to reduce a pressure therein; and a gas system configured to supply a process gas and an inert gas, which may be a dangerous gas, into the heating furnace. Thus, in order to limit expansion of earthquake damage including human injury, both the ensuring of safety and the early recovery are desired to be achieved at the same time.

DISCLOSURE OF THE INVENTION

The present invention has been made in light of the above circumstances. The object of the present invention is to provide a method for limiting expansion of earthquake damage and a system for limiting expansion of earthquake damage for use in a semiconductor manufacturing apparatus, which method and system are capable of predicting occurrence of an earthquake, and preventing flying of an object to be processed out of an opened container, falling over of the container which is being transferred, and flying of an object to be processed out of a holder which is being unloaded, so as to minimize the damage and to reduce the time required for recovery.

The present invention is a method for limiting expansion of earthquake damage for use in a semiconductor manufacturing apparatus that includes: a transfer area in which a container containing an object to be processed and having a lid is loaded and unloaded; a heating furnace for an object to be processed, the heating furnace having a furnace opening; and a working area disposed below the heating furnace, the working area being separated from the transfer area by a partition wall having an opening; wherein: the transfer area has a loading and unloading part for the container, a storage shelf part for the container, a transport part for the container disposed near the opening, and a transfer mechanism configured to transfer the container; and the working area has an elevating mechanism configured to load and unload a holder holding an object to be processed, the holder being placed on a lid member for opening and closing the furnace opening, and a door mechanism configured to open and close the opening of the partition wall and the lid of the container on the transport part; the method for limiting expansion of earthquake damage comprising: a step of receiving an emergency earthquake notice, which is delivered based on a preliminary tremor through a communication line, or of directly detecting a preliminary tremor; a first step of stopping an operation of the heating furnace based on the received emergency earthquake notice or the detected preliminary tremor; and; a second step that is carried out simultaneously with the first step, in which, when the door mechanism is opened, the door mechanism is closed.

The present invention is the method for limiting expansion of earthquake damage, wherein: the heating furnace includes a heater, a pressure-reducing pump, and valves for supplying a process gas and an inert gas; and the first step includes the steps of: when a predicted earthquake intensity determined based on the received emergency earthquake notice or the detected preliminary tremor is equal to or larger than a predetermined value, switching off the heater and the pressure-reducing pump, and closing the valves for a process gas and/or an inert gas; and when the predicted earthquake intensity is smaller than the predetermined value, leaving on the heater and/or the pressure-reducing pump, leaving open the valve for an inert gas, and closing the valve for a process gas.

The present invention is the method for limiting expansion of earthquake damage, wherein: the heating furnace includes a heater and valves for supplying a process gas and an inert gas; and the first step includes the steps of: when a predicted earthquake intensity determined based on the received emergency earthquake notice or the detected preliminary tremor is equal to or larger than a predetermined value, switching off the heater, and closing the valves for an inert gas and/or an inert gas; and when the predicted earthquake intensity is smaller than the predetermined value, leaving on the heater, leaving open the valve for an inert gas, and closing the valve for a process gas.

The present invention is the method for limiting expansion of earthquake damage, wherein the semiconductor manufacturing apparatus further comprises a detection mechanism configured to detach the lid from the container on the loading and unloading part and to detect a position of an object to be processed in the container, and the second step includes the steps of, when the detecting mechanism is being operated, returning the detection mechanism to an initial state and closing the lid.

The present invention is the method for limiting expansion of earthquake damage, wherein the semiconductor manufacturing apparatus comprises an aligning mechanism configured to receive an object to be processed from the working area side, and to position a mark formed in a circumference of the object to be processed, and the second step includes the step of operating a centering mechanism disposed on the aligning mechanism so as to restrain the object to be processed.

The present invention is the method for limiting expansion of earthquake damage, wherein the second step includes the steps of, when the transfer mechanism is being moved upward or downward, moving the transfer mechanism to a lowermost position and stopping the transfer mechanism at the lowermost position.

The present invention is the method for limiting expansion of earthquake damage, wherein the transfer mechanism has a transfer arm, and the second step includes the step of, when the transfer mechanism extends the transfer arm so as to carry the container onto the storage shelf part, or to carry the container from the storage shelf part, leaving the transfer arm to be extended.

The present invention is the method for limiting expansion of earthquake damage, wherein the semiconductor manufacturing apparatus comprises a receiving and sending mechanism configured to receive the container from the transfer mechanism and to send the container to the transport part, and the second step includes the step of, during the operation of the receiving and sending mechanism to receive and send the container to and from the transport part, leaving the receiving and sending mechanism to hold the container.

The present invention is the method for limiting expansion of earthquake damage, wherein the second step includes the step of, when the elevating mechanism is unloading the holder from the heating furnace, loading the holder again into the heating furnace.

The present invention is the method for limiting expansion of earthquake damage, wherein the semiconductor manufacturing apparatus comprises a holder table on which the holder can be placed for transporting the object to be processed, and a locking mechanism configured to lock the holder placed on the holder table, and the second step includes the step of, when the holder is being placed on the holder table, locking the holder by the locking mechanism.

The present invention is a system for limiting expansion of earthquake damage for use in a semiconductor manufacturing apparatus that includes: a transfer area in which a container containing an object to be processed and having a lid is loaded and unloaded; a heating furnace for an object to be processed, the heating furnace having a furnace opening; and a working area disposed below the heating furnace, the working area being separated from the transfer area by a partition wall having an opening; wherein the transfer area has a loading and unloading part for the container, a storage shelf part for the container, and a transport part for the container disposed near the opening, and a transfer mechanism configured to transfer the container; and the working area has an elevating mechanism configured to load and unload a holder holding an object to be processed, the holder being placed on a lid member for opening and closing the furnace opening, and a door mechanism configured to open and close the opening of the partition wall and the lid of the container on the transport part; the system for limiting expansion of earthquake damage comprising: a reception part configured to receive an emergency earthquake notice which is delivered based on a preliminary tremor through a communication line, or a preliminary-tremor detection part configured to directly detect a preliminary tremor; and a control part configured to carry out a first step in which an operation of the heating furnace is stopped based on the received emergency earthquake notice or the detected preliminary tremor, and a second step in which, when the door mechanism is being opened, the door mechanism is closed.

The present invention is the system for limiting expansion of earthquake damage, wherein: the heating furnace includes a heater, a pressure-reducing pump, and valves for supplying a process gas and an inert gas; and the first step includes the steps of: when a predicted earthquake intensity determined based on the received emergency earthquake notice or the detected preliminary tremor is equal to or larger than a predetermined value, switching off the heater and the pressure-reducing pump, and closing the valves for a process gas and/or an inert gas; and when the predicted earthquake intensity is smaller than the predetermined value, leaving on the heater and/or the pressure-reducing pump, leaving open the valve for an inert gas, and closing the valve for a process gas.

The present invention is the system for limiting expansion of earthquake damage, wherein: the heating furnace includes a heater and valves for supplying a process gas and an inert gas; and the first step includes the steps of: when a predicted earthquake intensity determined based on the received emergency earthquake notice or the detected preliminary tremor is equal to or larger than a predetermined value, switching off the heater, and closing the valves for an inert gas and/or an inert gas; and when the predicted earthquake intensity is smaller than the predetermined value, leaving on the heater, leaving open the valve for an inert gas, and closing the valve for a process gas.

The present invention is the system for limiting expansion of earthquake damage, wherein the semiconductor manufacturing apparatus further comprises a detection mechanism configured to detach the lid from the container on the loading and unloading part and to detect a position of an object to be processed in the container, and the second step includes the steps of, when the detecting mechanism is being operated, returning the detection mechanism to an initial state and closing the lid.

The present invention is the system for limiting expansion of earthquake damage, wherein the semiconductor manufacturing apparatus comprises an aligning mechanism configured to receive an object to be processed from the working area side, and to position a mark formed in a circumference of the object to be processed, and the second step includes the step of operating a centering mechanism disposed on the aligning mechanism so as to restrain the object to be processed.

The present invention is the system for limiting expansion of earthquake damage, wherein the second step includes the steps of, when the transfer mechanism is being moved upward or downward, moving the transfer mechanism to a lowermost position and stopping the transfer mechanism at the lowermost position.

The present invention is the system for limiting expansion of earthquake damage, wherein the transfer mechanism has a transfer arm, and the second step includes the step of, when the transfer mechanism extends the transfer arm so as to carry the container onto the storage shelf part, or to carry the container from the storage shelf part, leaving the transfer arm to be extended.

The present invention is the system for limiting expansion of earthquake damage, wherein the semiconductor manufacturing apparatus comprises a receiving and sending mechanism configured to receive the container from the transfer mechanism and to send the container to the transport part, and the second step includes the step of, during the operation of the receiving and sending mechanism to receive and send the container to and from the transport part, leaving the receiving and sending mechanism to hold the container.

The present invention is the system for limiting expansion of earthquake damage, wherein the second step includes the step of, when the elevating mechanism is unloading the holder from the heating furnace, loading the holder again into the heating furnace.

The present invention is the system for limiting expansion of earthquake damage, wherein the semiconductor manufacturing apparatus comprises a holder table on which the holder can be placed for transporting the object to be processed, and a locking mechanism configured to lock the holder placed on the holder table, and the second step includes the step of, when the holder is being placed on the holder table, locking the holder by the locking mechanism.

According to the present invention, an operation of the semiconductor manufacturing apparatus is stopped, by using an emergency earthquake notice of a preliminary tremor (P wave), which has been detected about ten or more seconds before a principal motion (S wave) and is delivered through a communication line, or by directly detecting the preliminary tremor. Simultaneously therewith, when the door mechanism is being opened, the door mechanism is closed. Thus, flying of an object to be processed out of the container by an earthquake, which may result in falling and breaking of the object to be processed, can be prevented, so as to minimize the damage and to reduce the time required for recovery.

BRIEF DESCRIPTION OF THE DRAWINGS

FIGS. 11(a) to 11(c) are views schematically showing a boat on a first table, in which FIG. 11(a) is a perspective view, FIG. 11(b) is an enlarged plan view from which a top plate and support columns of the boat are omitted, and FIG. 11(c) is a sectional view taken along the line c-c in FIG. 11(b).

BEST MODE FOR CARRYING OUT THE INVENTION

Figure 1:
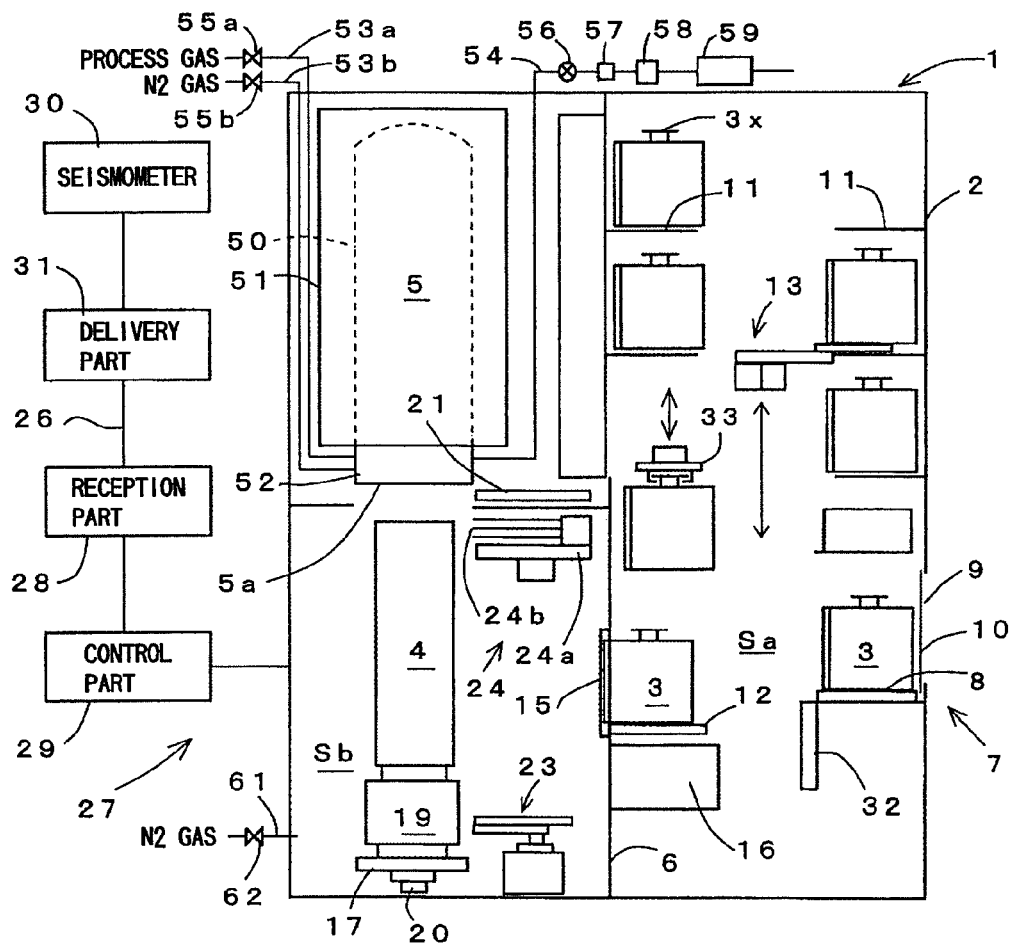
FIG. 1 is a view schematically showing a system for limiting expansion of earthquake damage for use in a semiconductor manufacturing apparatus in one embodiment of the present invention.
Figure 2:
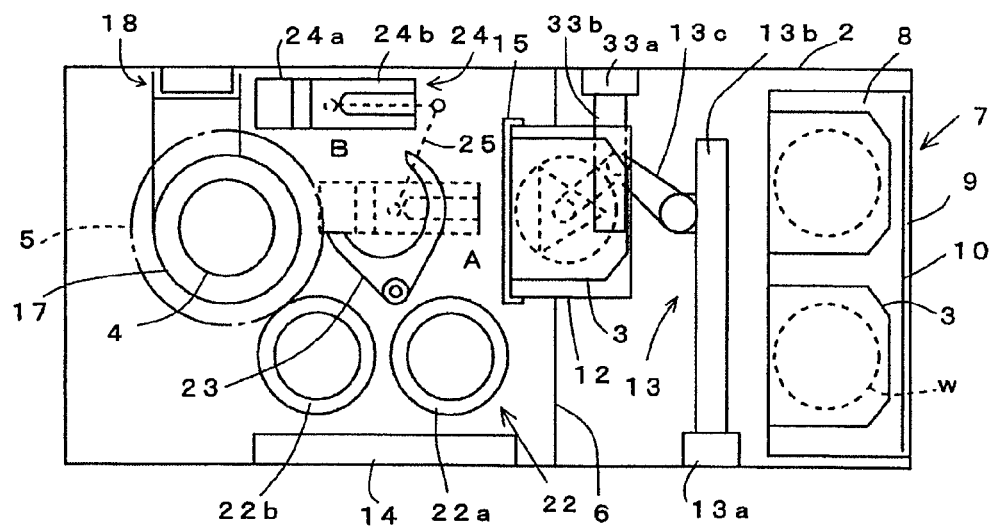
FIG. 2 is a cross-sectional view of the semiconductor manufacturing apparatus shown in FIG. 1.

A best mode for carrying out the present invention will be described herebelow with reference to the accompanying drawings. FIG. 1 is a view schematically showing a system for limiting expansion of earthquake damage for use in a semiconductor manufacturing apparatus in one embodiment of the present invention. FIG. 2 is a cross-sectional view of the semiconductor manufacturing apparatus shown in FIG. 1.

FIGS. 3(a) to 3(f) are explanatory views for explaining an opening and closing operation of a lid of a FOUP in a loading port part.

In the drawings, the reference number 1 depicts a semiconductor manufacturing apparatus, such as a vertical heat processing apparatus, which is placed in a clean room. The heat processing apparatus 1 includes a housing 2 that defines an outer contour of the apparatus. In the housing 2, there are formed a transfer area Sa in which a FOUP 3, which serves as a container containing an object to be processed (semiconductor wafer) W and has a lid, is loaded and unloaded; a heating furnace 5 for a wafer W, the heating furnace 5 having a furnace opening 5a; and a loading area (working area) Sb which is disposed below the heating furnace 5, and is separated from the transfer area Sa by a partition wall 6 having an opening 34. The transfer area Sa includes a loading port (loading and unloading part) 7 for the FOUP 3 as a container containing a plurality of semiconductor wafers W, a storage shelf part 11, and a transport stage (transport part) 12. In the loading area Sb, a wafer W is transported between a boat (holder) 4, which is capable of vertically holding a number of, e.g., about 100 to 150 wafers W at predetermined pitches, and the FOUP 3 placed on the transport stage 12, and the boat 4 is loaded into the heating furnace 5 and is unloaded therefrom.

The FOUP 3 is a plastic container capable of vertically holding and carrying a plurality of, e.g., about 13 to 25 wafers of a predetermined bore, such as 300 mm wafers, in a horizontal state at predetermined intervals therebetween. The FOUP 3 has a detachable lid 3a for hermetically sealing an opening, which is formed in a front part of the FOUP 3 through which a wafer is taken into and out of the FOUP 3. In a front surface of the lid 3a, there is formed a key hole (not shown) of a lock mechanism disposed on the lid 3a. As an apparatus that can insert a key member into the key hole and rotate the key member so as to lock and unlock the lid 3a, in order that the lid is attached to the FOUP 3 and is detached therefrom, there is used a lid attaching and detaching apparatus which is described in JP2002-353289A, for example. Such lid attaching and detaching apparatuses are disposed on the loading port 7 and a door mechanism 15.

On a front part of the housing 2, there is disposed the loading port (loading and unloading part) 7 through which the FOUP 3 is loaded and unloaded by an operator or a transfer robot. The loading port 7 is composed of a table 8 on which the FOUP 3 can be placed, the table being disposed on the front part in the housing, and an opening 9 formed in the front surface of the housing 2, through which the FOUP 3 can be delivered to the table 8 and returned therefrom. The opening 9 preferably has a door 10 capable of moving upward and downward.

Figure 3:
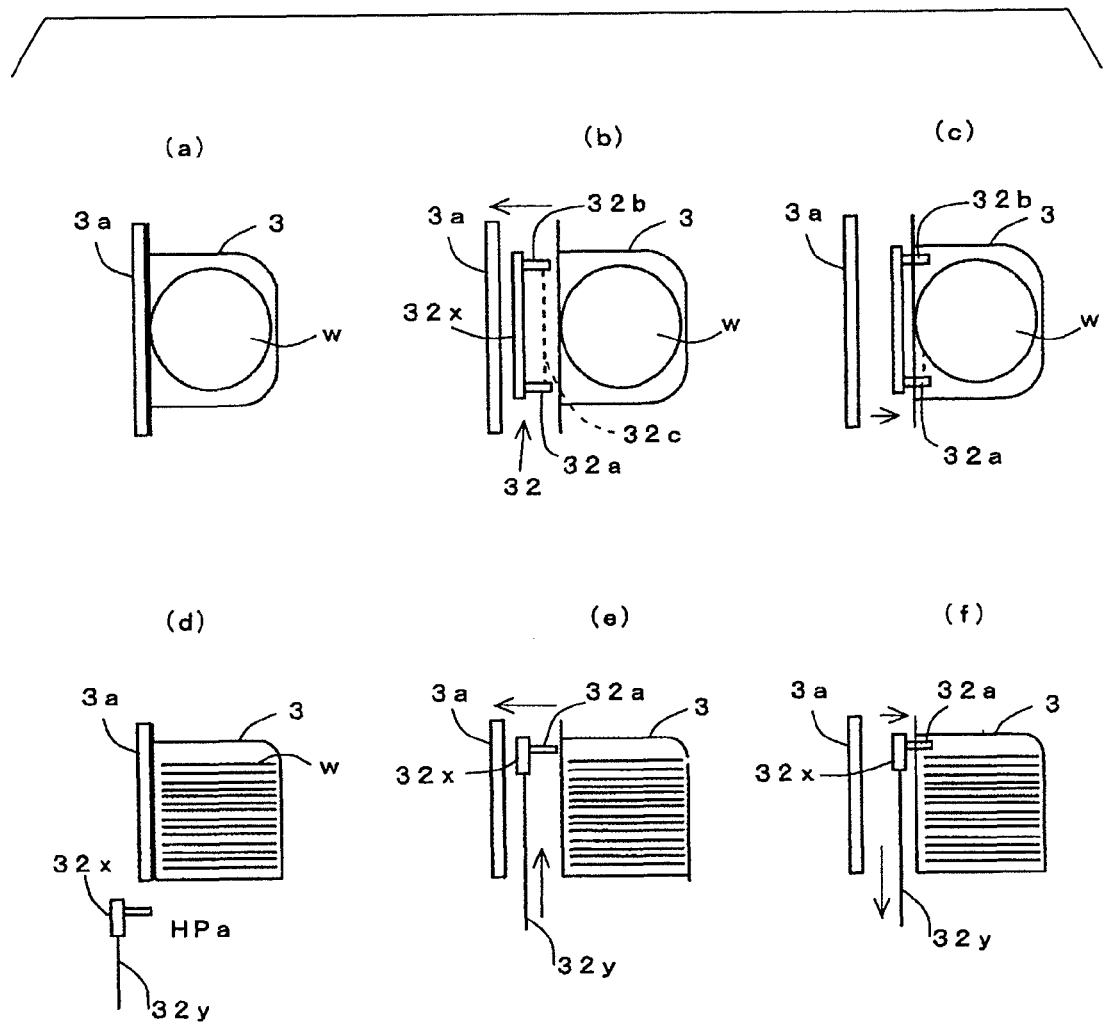
FIGS. 3(a) to 3(f) are explanatory views for explaining an opening and closing operation of a lid of a FOUP in a loading port part.

Behind the table 8 of the loading port 7, there is disposed a detection mechanism 32 capable of opening the lid 3a of the FOUP 3, and detecting the positions and the number of wafers W. The detection mechanism 32 is equipped with the aforementioned lid attaching and detaching apparatus. As shown in FIG. 3, the detection mechanism 32 includes: a pair of right and left light-emission part 32a and light-reception part 32b which are opposedly spaced from each other; a detection head 32x capable of detecting the presence of a wafer W; and a drive part, not shown, for moving the detection head 32x in an up and down direction and also in a fore and aft direction. The presence of a wafer W can be detected based on whether a light beam 32c between a light-emission part 32a and a light-reception part 32b is interrupted or not.

On a side of the partition wall 6 in the transfer area Sa, there is disposed the transport stage 12 on which the FOUP 3 can be placed for transporting a wafer. Above the transport stage 12 and above the table 8, there are disposed a plurality of storage shelf parts 11 each of which can accommodate the FOUP 3.

The transfer mechanism 13 is mainly composed of: an elevating arm 13b that is moved up and down by an elevating mechanism 13a disposed on one side of the transfer area Sa; and a transfer arm 13c that is disposed on the elevating arm 13b and is capable of horizontally transferring the FOUP 3 by supporting a bottom part thereof.

Figure 9:
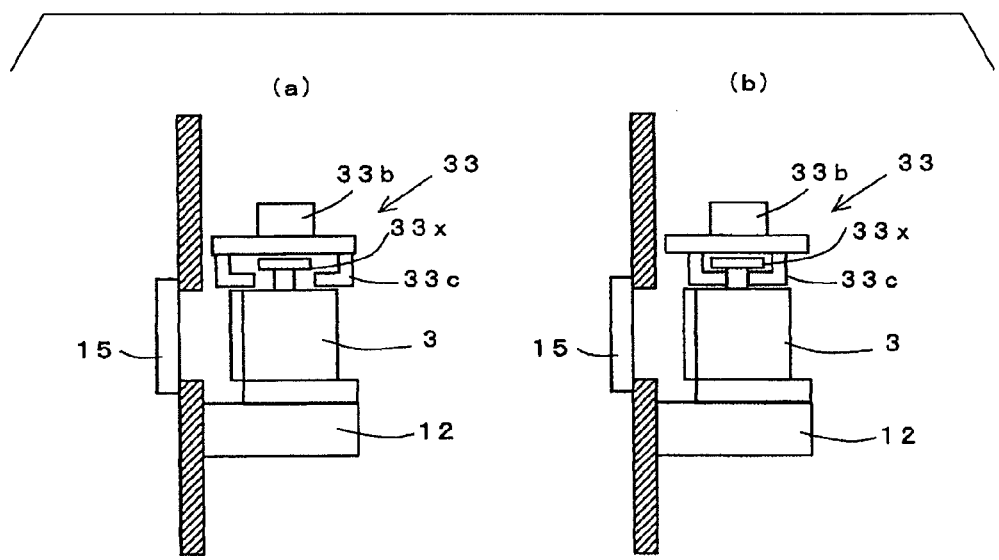
FIGS. 9(a) and 9(b) are explanatory views for explaining an operation of a FOUP catcher in the wafer transport part upon occurrence of an earthquake.

The transfer area Sa is filled with an atmospheric air that is cleaned by an air cleaner (fan filter unit), not shown. The loading area Sb is also cleaned by an air cleaner (fan filter unit) 14 disposed on one side of the loading area Sb, and is filled with an atmospheric air of a positive pressure or an inert gas (such as $N_2$ gas). The transfer area Sa is provided with a FOUP catcher (receiving and sending mechanism) 33 that receives the FOUP 3 from the transfer mechanism 13 and sends the FOUP 3 to the transport stage 12. As shown in FIGS. 2 and 9, the FOUP catcher 33 is mainly composed of: an elevating arm 33b that is moved up and down by an elevating mechanism 33a disposed on one side of the transfer area Sa; and a holding mechanism 33c disposed on the elevating arm 33b, the holding mechanism 33c being capable of holding an upper support part 3x of the FOUP 3. The FOUP catcher 33 receives the FOUP 3 from the transfer mechanism 13 and then waits. Thus, during when the transfer mechanism 13 transfers another FOUP 3 from the transport stage 12 to the storage shelf part 11 or the table 8 of the loading port 7, the FOUP catcher 33 can places the FOUP 3 onto the transport stage 12, so as to promote the efficiency of the transfer operation.

Figure 4:
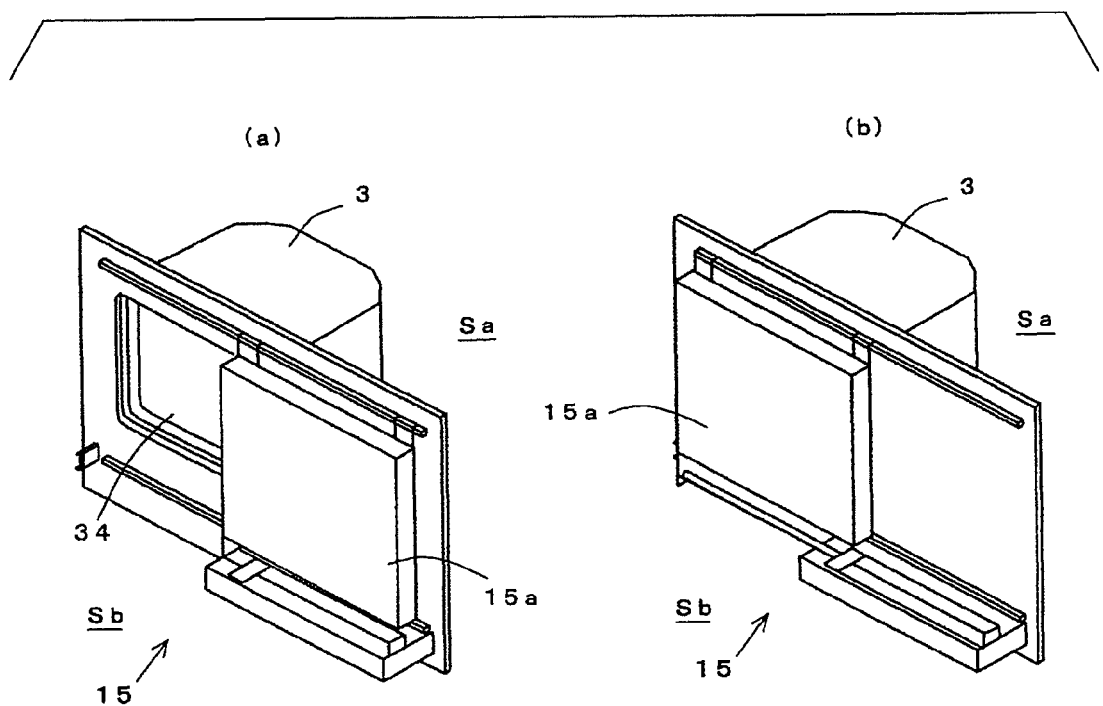
FIGS. 4(a) and 4(b) are explanatory views for explaining an opening and closing operation of a door mechanism that opens and closes the lid of the FOUP in a wafer transport part.

As also shown in FIG. 4, the partition wall 6 includes: an opening 34 with which the front surface of the FOUP 3 placed on the transport stage 12 is brought into contact from the side of the transfer area Sa, so that the inside of the FOUP 3 and the inside of the loading area Sb are communicated with each other; and the door mechanism 15 having a door 15a capable of closing the opening 34 on the side of the loading area Sb. The opening 34 is formed to have substantially the same bore as that of the front opening (opening through which a wafer is taken in and taken out) of the FOUP 3, so that a wafer W in the FOUP 3 can be taken in and out through the opening 34. The door mechanism 15 is configured to open and close the opening 34 by sliding the door 15a in the right and left direction. The aforementioned attaching and detaching apparatus is incorporated in the door 15a. The transport stage 12 is equipped with a pressing mechanism, not shown, for pressing the FOUP 3 such that the front surface of the FOUP 3 is in contact with a peripheral part of the opening 34.

Below the transport stage 12, there is disposed a notch aligner (aligning mechanism) 16 for arranging notches (cutouts) of wafers W in the same direction, the notches serving as marks provided in the peripheral parts of the wafers W for aligning a crystal direction. The notch aligner 16 is opened toward the loading area Sb, and is configured to align notches of the wafers W which are transported by a transport mechanism 24, which is described below, from the FOUP 3 on the transport stage 12.

Figure 5:
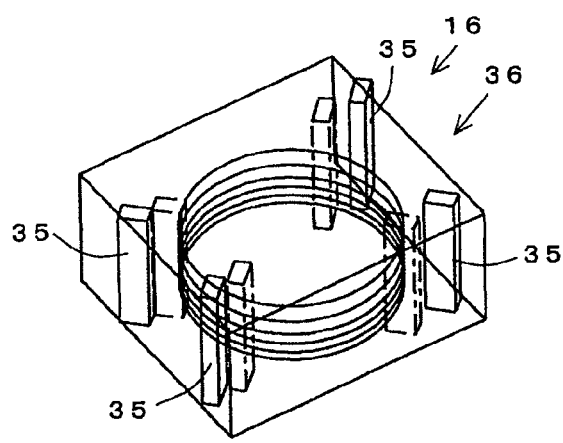
FIG. 5 is a perspective view schematically showing an example of a notch aligner.
Figure 6:
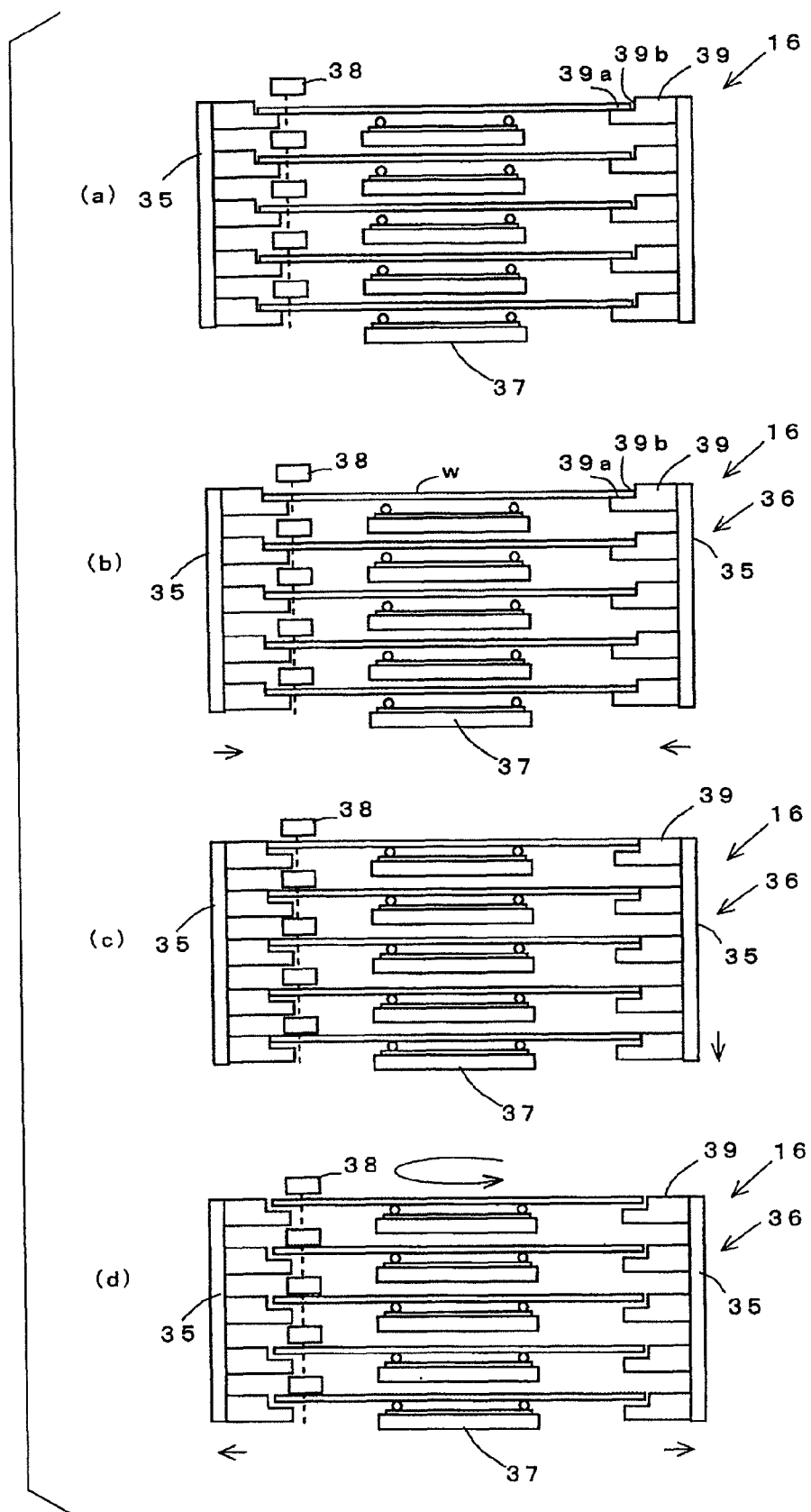
FIGS. 6(a) to 6(d) are explanatory views for explaining an operation of the notch aligner.

As shown in FIGS. 5 and 6, the notch aligner 16 includes: a centering mechanism 36 having support members 35 which are four blocks in plan view and are capable of vertically supporting peripheries of a plurality of, e.g., five wafers W at predetermined intervals therebetween; a rotation mechanism 37 capable of bringing up the lower central portions of the respective wafers W supported by the support members 35 and horizontally rotating the respective wafers W; and a sensor 38 capable of detecting notches of the respective wafers. When the sensor 38 detects the notches, the rotation of the wafers by the rotation mechanism 37 is stopped, and the notches are aligned. Each of the support members 35 has a plurality of, e.g., five support pieces 39 of an L-shaped section which are vertically arranged at predetermined intervals therebetween. A horizontal surface 39a of the support piece 39 is adapted to receive the peripheral part of the lower surface of the wafer W, and a vertical surface 39b of the support piece 39 is adapted to restrict a position of the peripheral part of the wafer W.

As shown in FIG. 6(b), the support members 35 of the centering mechanism 36 are moved closer to each other by a moving mechanism, so that the centers of the wafers W are placed in position. In addition, as described below, with the use of the centering mechanism 36, the wafer can be restricted upon occurrence of an earthquake so as to prevent flying of the wafer. Among FIGS. 6(a) to 6(d), FIG. 6(a) is a view in which the wafers are placed on the support pieces of the support members, FIG. 6(b) is a view in which the support members are moved closer to each other so that the centers of the wafers are placed in position, FIG. 6(c) is a view in which the wafers are supported by the rotation mechanism which is moved upward, and FIG. 6(d) is a view in which the support members are moved away from each other and the wafers are rotated by the rotation mechanism.

Located on an upper rear part of the loading area Sb is the vertical heating furnace 5 having the furnace opening 5a in a lower part thereof. In addition, the loading area Sb includes: a lid member 17 that opens and closes the furnace opening 5a of the heating furnace 5; and an elevating mechanism 18 that vertically moves the lid member 17, on which the boat 4 made of, e.g., quartz, which vertically holds a number of, e.g., about 100 to 150 wafers W at predetermined intervals, is placed, so as to load the boat 4 into the heating furnace 5 and to unload the boat 4 therefrom. Disposed on the upper part of the lid member 17 is a heat retention tube (heat shielding member) 19 that suppresses the heat release through the furnace opening 5a when the lid member 17 is closed. The boat 4 can be placed on an upper part of the heat retention tube 19. The lid member 17 is equipped with a rotation mechanism 20 that rotates the boat 4 via the heat retention tube 19. Near the furnace opening 5a, there is disposed a shutter 21 that can be horizontally moved (turned) so as to open and close the furnace opening 5a. When the lid member 17 is opened and the thermally processed boat 4 is unloaded, the shutter 21 blocks the furnace opening 5a. The shutter 21 has a shutter drive mechanism, not shown, for horizontally turning the shutter 21 to be opened and closed.

On one side of the loading area Sb, i.e., on a side of the air cleaner 14, there is disposed a boat table (also referred to as a holder table or a boat stage) on which the boat 4 can be placed for the transport of the wafers W. The boat table 22 may include one table. However, as shown in FIG. 2, the boat table 22 preferably includes a first table (charge stage) 22a and a second table (standby stage) 22b which are arranged along the air cleaner 14 in the forward and rearward direction.

At a lower part in the loading area Sb and at a position between the transport stage 12 and the heating furnace 5, there is disposed a boat transfer mechanism 23 that transfers the boat 4 between the boat table 22 and the lid member 17, more specifically, between the first table 22a or the second table 22b of the boat table 22 and the lowered lid member 17, and between the first table 22a and the second table 22b. In addition, disposed above the boat transfer mechanism 23 is the transport mechanism 24 that transports the wafers W between the FOUP 3 on the transport stage 12 and the boat 4 on the boat table 22, more specifically, between the FOUP 3 on the transport stage 12 and the notch aligning mechanism 16, between the notch aligning mechanism 16 and the boat 4 on the first table 22a of the boat table 22, and between the boat 4 which has been thermally processed on the first table 22a and the vacant FOUP 3 on the transport stage 12.

As shown in FIG. 11(a), the boat 4 has a top plate 4a, a bottom plate 4b, and a plurality of, e.g., four support columns 4c disposed therebetween. The bottom plate 4b has an annular shape in plan view. A small-diameter part 4d having a diameter smaller than that of the bottom plate 4b is disposed on a lower part of the bottom plate 4b. The boat transfer mechanism 23 is configured to transfer the boat 4, with the small-diameter part 4d of the bottom plate 4b of the boat 4 being held by a holding part 23a (see, FIG. 2) having a C-shape in plan view. The support column 4c has grooves, not shown, for vertically holding the wafers at predetermined intervals therebetween. A space between the right and left support columns 4c on the front side are enlarged to allow the wafer to be taken in and out.

The first table 22a is provided with a locking mechanism 45 for locking the boat 4 on the first table 22a. The locking mechanism 45 includes: a pair of rollers 45a that are disposed projectingly from the upper part of the first table 22a, and are positioned inside an opening 4e formed in the bottom plate 4b of the boat 4; and drive parts such as air cylinders 45 that move the rollers 45a away from or closer to each other to press or separate the rollers 45a onto or from the inner periphery of the opening 4e of the bottom plate 4b so as to lock and unlock the boat 4. The locking mechanism 45 is configured to be controlled by a control part 29 in a second step.

The transport mechanism 24 includes a base table 24a capable of horizontally rotating, and a plurality of, e.g., five thin transport arms 24b disposed on the base table 24a. The transport arms 24 can be moved, with semiconductor wafers being placed thereon. In order to avoid interference with the boat 4 which is being transferred, as shown in FIG. 2, the transport mechanism 24 can be moved in the lateral direction through a turning arm 25 from a working position A shown by the imaginary line to a retracted position B shown by the solid line. The five transport arms 24b are preferably composed of the one central arm for transporting one wafer, and the other four transport arms which can be independently moved from the central arm on the base table 24a. Pitches of the other four transport arms can be vertically varied with respect to the central transport arm. A proximal part of the turning arm 25 is connected to an elevating mechanism, not shown, disposed on the other side of the loading area Sb, so that the transport mechanism 24 can be moved up and down.

As shown in FIG. 1, the heating furnace 5 includes a cylindrical processing vessel (reaction tube) 50 made of quartz glass, with an upper end of the processing vessel 50 being closed and a lower end thereof being opened; and a heater 51 disposed to surround a circumference of the processing vessel 50. Connected to a lower end part of the processing vessel 50 is a cylindrical manifold 52 having a gas introduction pipe part through which a process gas and an inert gas (such as $N_2$ gas) are supplied, and an exhaust pipe part. Gas supply pipes 53a and 53b for supplying a process gas and an inert gas are connected to the gas introduction pipe part, and an exhaust pipe 54 is connected to the exhaust pipe part.

The gas supply pipes 53a and 53b are respectively equipped with valves 55a and 55b for opening and closing the pipes 53a and 53b. Connected to the exhaust pipe 54 are a main valve 56 for opening and closing, a pressure adjusting valve 57, an exhaust trap 58, and a pressure-reducing pump 59, in this order. In a vertical processing apparatus of such a type in which the loading area Sb is filled with an inert gas (such as an $N_2$ gas), a gas supply pipe 61 for supplying an inert gas is connected to the loading area Sb, and a valve 62 is disposed in the gas supply pipe 61.

In order to protect the vertical heat processing apparatus 1 as structured above, a method for limiting expansion of earthquake damage for use in the vertical heat processing apparatus 1 includes: a step in which an emergency earthquake notice, which is delivered based on a preliminary tremor (P wave) through a communication line 26, is received; a first step in which an operation of the vertical heat processing apparatus 1 is stopped based on the emergency earthquake notice; and a second step that is simultaneously carried out with the first step, in which, when the door mechanism 15 is being opened, the door mechanism 15 is closed so as to prevent a wafer W from flying out of the heat processing apparatus 1. A system for limiting expansion of earthquake damage for performing the method includes a reception part 28 configured to receive an emergency earthquake notice, which is delivered based on a preliminary tremor (P wave) through the communication line 26; and the control part 29 configured to carry out the first step in which an operation of the vertical heat processing apparatus 1 is stopped based on the emergency earthquake notice, and a second step in which, when the door mechanism 15 is being opened, the door mechanism 15 is closed so as to prevent flying of a wafer W.

As the emergency earthquake notice, there can be employed an emergency earthquake notice provided by the meteorological agency, and an emergency earthquake detection system provided by a third-party organization. An earthquake is composed of a preliminary tremor of slight vibrations caused by a P wave (Primary wave) that is a fast longitudinal wave (7 k to 8 km per second), and a principal motion of strong vibrations caused by an S wave (Secondary wave) that is a slow transverse wave (3 k to 4 km per second). An earthquake source, an earthquake intensity, and an arrival time of an S wave can be calculated by processing data of P waves collected by a number of seismometers 30 installed in many regions of the nation. The earthquake notice is delivered from a delivery part 31 through a wired circuit and/or a satellite circuit, and the earthquake notice is received by the reception part 28. Thus, an earthquake intensity can be predicted in a period from several seconds to ten or more seconds before a main shock that generates strong vibrations arrives, whereby required measures can be taken beforehand against the main shock. The control part 29 is preferably configured such that, when a predicted earthquake intensity is larger than a predetermined threshold value, which has been preset (e.g., a predicted earthquake intensity of 5), the control part 29 performs the method for limiting expansion of earthquake damage. The threshold value can be optionally set by a user in consideration of an earthquake-resistant strength of a building or the like. In order to achieve both the ensuring of safety and the early recovery at the same time, preferable avoidance operations of the pump system and the gas system are as follows. Namely, there are a case in which a predicted earthquake intensity is equal to or larger than a predetermined value (e.g., 5-plus or more), and a case in which a predicted earthquake intensity is smaller than the predetermined value (e.g., 5-minus or less). When a predicted earthquake intensity is equal to or larger than the predetermined value, an apparatus (semiconductor manufacturing apparatus) is stopped with priority being given to the ensuring of safety so as to minimize human injury and material damage. On the other hand, when a predicted earthquake intensity is smaller than the predetermined value, the apparatus is stopped with priority being given to the early recovery.

Basically, in the first step, a power source (main power source) and a gas line of the heat processing apparatus 1 are shut off. However, the main power source may be left on immediately before a main shock (S wave) arrives. When the main power source is switched off in the first step (P wave), an auxiliary power source is reserved for the detection mechanism 32 including the lid attaching and detaching apparatus that is driven to prevent flying of wafers, the door mechanism 15, the notch aligner 16, the elevating mechanism 18, the transfer mechanism 13 that is driven to prevent falling of the FOUP 3, and the FOUP catcher 33.

To be specific, in the first step, when a predicted earthquake intensity is equal to or larger than the predetermined value, since the apparatus is stooped with priority being given to the ensuring of safety so as to minimize human injury and material damage, it is preferable that the heater 51 and the pressure-reducing pump 59 are switched off, and that the valves 55a and 55b for a process gas (actual gas) and an inert gas are closed. The main valve 56 is also preferably closed.

When a predicted earthquake intensity is smaller than the predetermined value, since the apparatus is stopped with priority being given to the early recovery, it is preferable that the heater 51 and the pressure-reducing pump 59 are left on, and that the valve 55b for an inert gas is left opened while the valve 55a for a process gas is closed. The main valve 56 in the exhaust pipe 54 is preferably left opened. "To leave on the heater 51" means that a power source of the heater 51 is left on so that a temperature of the heater 51 is maintained at a set temperature. "To leave open the valve 55b for an inert gas" means, for example, that a cycle purge (in which $N_2$ is supplied, the $N_2$ supply is stopped, and the $N_2$ is evacuated, which are repeatedly performed, so as to make lower an oxygen concentration than a predetermined value for a short period of time) is continued, that a dilution discharge (when a process gas in the processing vessel is discharged, the process gas is discharged while it is being diluted by $N_2$) is continued, or that a supply of $N_2$ into the loading area is continued. The control for opening and closing the main valve 56 and the valves 55a, 55b, and 62, and the control for switching on and off the heater 51 and the pressure-reducing pump 59 are performed by the control part 29 based on a predicted earthquake intensity.

Meanwhile, in this embodiment, in the second embodiment, when the door mechanism 15 is being opened (see, FIG. 4(a)), the control part 29 is configured to close the door mechanism 15 (see, FIG. 4(b)).

According to the method for limiting expansion of earthquake damage or the system for limiting expansion of earthquake damage 27, an operation of the vertical heat processing apparatus 1 is stopped with the use of an emergency earthquake notice, which has been detected based on a preliminary tremor (P wave) in a period from several periods to ten or more periods before a principal motion (S wave) and is delivered through the communication line 26. Simultaneously therewith, as shown in FIG. 4, when the door mechanism 15 is being opened (see, FIG. 4(a)), the door mechanism 15 is closed (see, FIG. 4(b)). Thus, the wafers W can be prevented from flying out of the FOUP 3 on the transport stage 12, whereby expansion of material damage such as breakage of the wafers W and elongation of time lost for recovery of the apparatus can be prevented.

In particular, the heating furnace 5 includes the heater 51, the pressure-reducing pump 59, and the valves 55a and 55b for supplying a process gas and an inert gas. The first step includes the following steps. Namely, when a predicted earthquake intensity is equal to or larger than the predetermined value, the heater 51 and the pressure-reducing pump 59 are switched off, and the valves 55a and 55b for a process gas and an inert gas are closed. On the other hand, when a predicted earthquake intensity is smaller than the predetermined value, the heater 51 and the pressure-reducing pump 59 are left on, and the valve 55b for an inert gas is left opened while the valve 55a for a process gas is closed. Therefore, both the ensuring of safety and the early recovery can be achieved at the same time in the avoidance operations of the pump system and the gas system.

Before a power source is switched on again to resume the apparatus, the condition of the apparatus, the condition of the wafers, and the condition of the boat are confirmed by an operator. The operator judges whether an operation of the apparatus is possible or not. When judged as impossible, factors making impossible the operation (for example, lot-out of a wafer, breakage or displacement of a wafer, breakage or displacement of a boat, leakage of a gas, leakage of water, and electrical leakage) are eliminated. Then, after it is confirmed that conditions for activating the apparatus (for example, operations of a valve for a process gas and a pressure-reducing pump, and an operation of a transfer system) have been satisfied, the apparatus is activated.

As shown in FIG. 3, when the lid 3a of the FOUP 3 has been opened by the detection mechanism 32 (see, FIGS. 3(b) and 3(e)), and the detection head 32x of the detection mechanism 32 is moved closer to the wafers W in the FOUP 3 (see, FIGS. 3(c) and 3(d)) so as to detect the wafers W, the second step preferably includes the following steps. Namely, the detecting operation of the detection head 32x is suspended, the detection head 32x is returned to a below original position (home position) HPa, and the lid 3a of the FOUP 3 is closed (see, FIGS. 3(a) and 3(d)). Namely, when the detection mechanism 32 is being operated, the detection mechanism 32 is returned to its initial state and the lid 3a is closed. Thus, the wafers W can be prevented from flying out of the FOUP 3 by the earthquake, whereby expansion of material damage such as breakage of the wafers W and elongation of time lost for recovery of the apparatus can be prevented. In addition, since the detection head 32x of the detection mechanism 32 is returned to the home position Hpa, the semiconductor manufacturing apparatus 1 can be promptly restored.

In the second step, as shown in FIGS. 5, 6(b), and 6(c), it is preferable that the centering mechanism 36 disposed on the notch aligner 16 is operated so as to restrain the wafers W. Thus, expansion of material damage such as breakage of the wafers W by the earthquake, which might be caused by flying of the wafer W out of the notch aligner 16, and elongation of time lost for recovery of the apparatus can be prevented.

Figure 7:
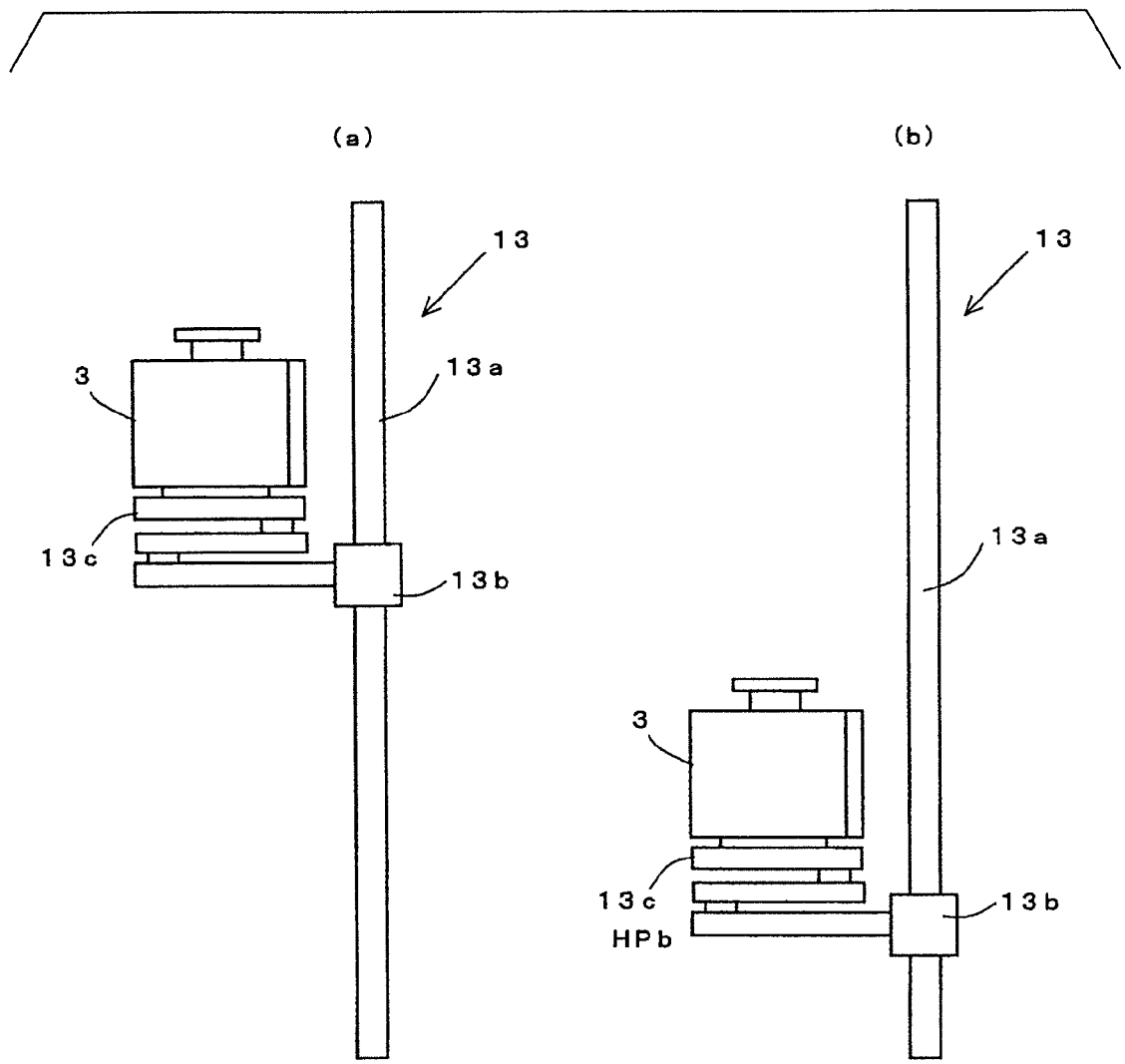
FIGS. 7(a) and 7(b) are explanatory views for explaining an up and down movement of a FOUP transfer mechanism.
Figure 8:
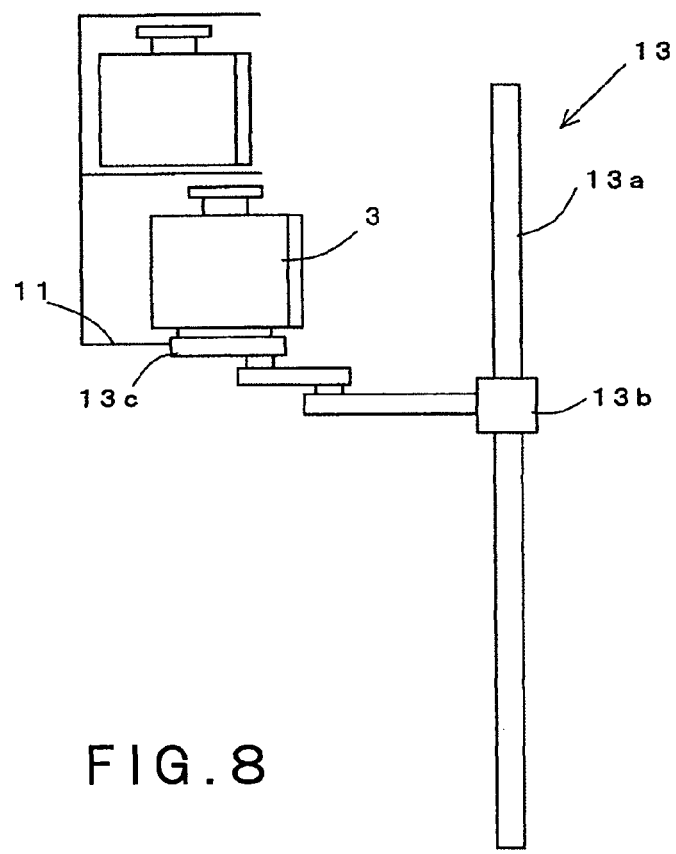
FIG. 8 is a view showing an arm of the FOUP transfer mechanism, the arm being extended.

In the second step, as shown in FIGS. 7(a) and 7(b), when the transfer mechanism 13 is being moved upward or downward, the transfer mechanism 13 is preferably moved to a lowermost position, i.e., a home position HPb and stopped thereat. Thus, the FOUP 3 can be prevented from falling from the transfer arm 13c of the transfer mechanism 13 at a higher position by the earthquake, whereby the expansion of material damage such as breakage of the wafers W, which might be caused by the falling of the FOUP, 3 can be prevented. When the transfer mechanism 13 is not being moved upward or downward, but the transfer arm 13c is being extended so as to carry the FOUP 3 onto the storage shelf part 11 or to carry the FOUP 3 from the storage shelf part 11, the transfer mechanism 13 is not controlled to be moved to the lowermost position, but the transfer arm 13c is left extended in the second step 2.

In the second step, as shown in FIGS. 9(a) and 9(b), during the operation of the FOUP catcher 33 to receive and send the FOUP 3 to and from the transport stage 12, when the holding mechanism 33c of the FOUP catcher 33 is opened to release the FOUP 3, the holding mechanism 33c is preferably closed to hold the FOUP 3. Thus, the FOUP 3 can be prevented from falling from the transport stage 12, and expansion of material damage such as breakage of the wafers W, which might caused by the falling of the FOUP 3, can be prevented.

Figure 10:
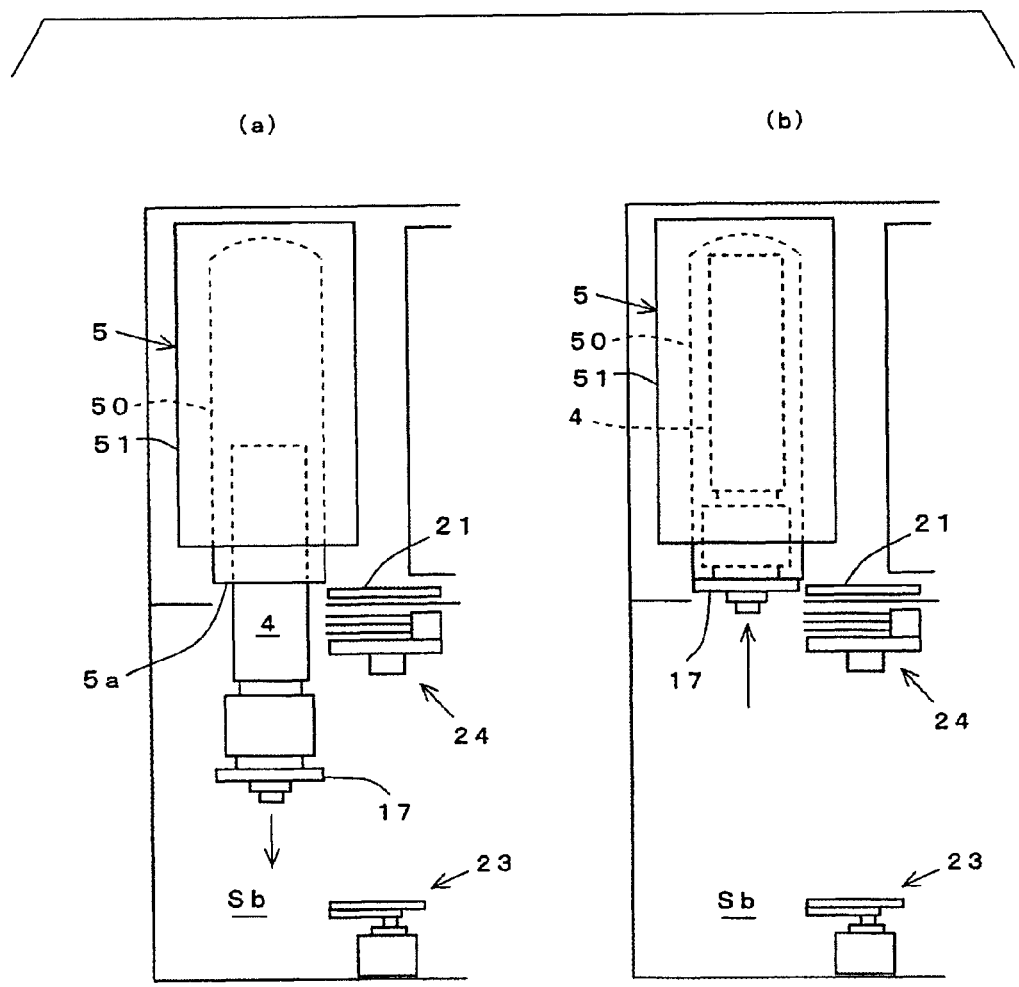
FIGS. 10(a) and 10(b) are explanatory views for explaining an operation for unloading a boat from a heating furnace upon occurrence of an earthquake.

In addition, in the second step, as shown in FIGS. 10(a) and 10(b), when the elevating mechanism 18 is unloading the boat 4 from the heating furnace 5, the boat 4 is preferably again loaded into the heating furnace 5. Thus, even when an earthquake occurs when the boat 4 is being unloaded from the heating furnace 5, the wafers W can be prevented from flying out of the boat 4, whereby expansion of material damage such as breakage of the wafers W and elongation of time lost for recovery of the apparatus can be prevented.

Figure 11:
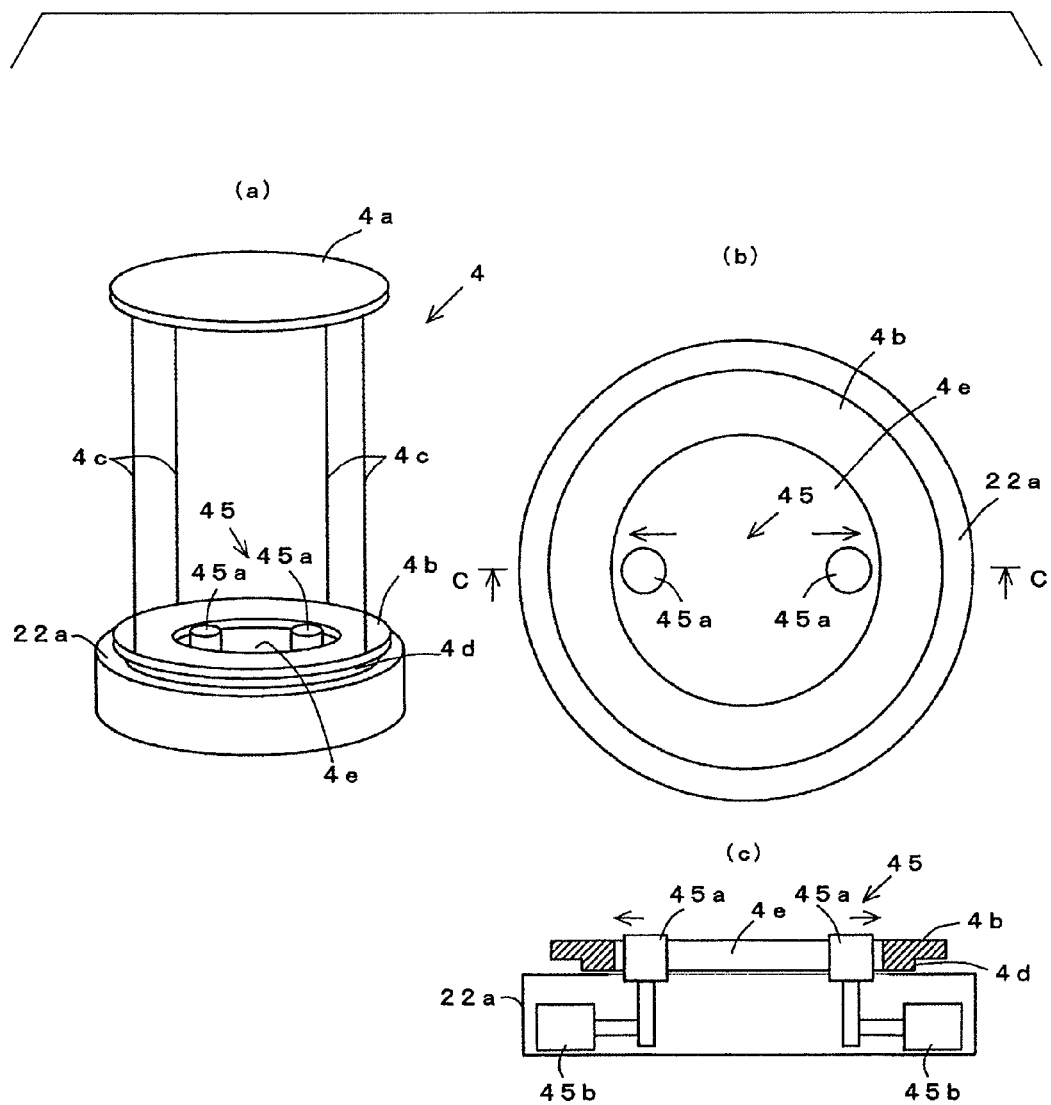

In the second step, as shown in FIG. 11, when the boat 4 is being placed on the first table 22a as a boat table, the locking mechanism 45 preferably locks the boat 4. Thus, the boat 4 on the first table 22a can be prevented from falling over.

Figure 12:
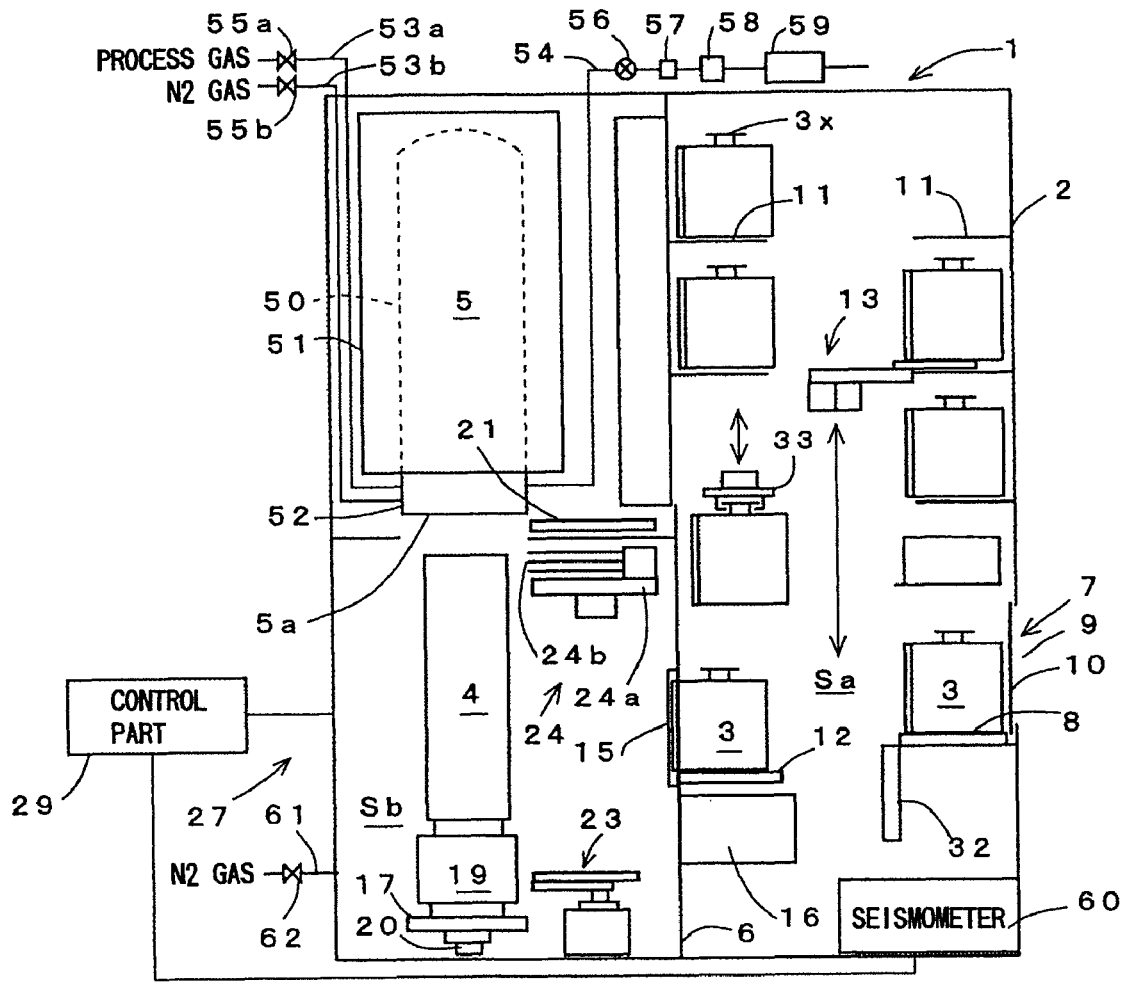
FIG. 12 is a view schematically showing a system for limiting expansion of earthquake damage for use in a semiconductor manufacturing apparatus in another embodiment of the present invention.

FIG. 12 is a view schematically showing a system for limiting expansion of earthquake damage for use in a semiconductor manufacturing apparatus in another embodiment of the present invention. In the embodiment shown in FIG. 12, the components identical to those of the embodiment shown in FIG. 1 are represented by the same reference numbers, and a detailed description thereof is omitted. A vertical heat processing apparatus 1 in this embodiment includes: a seismometer 60 that is a preliminary-tremor detection part capable of directly detecting a preliminary tremor; and a control part 29 configured to carry out a first step in which an operation of the vertical heat processing apparatus 1 is stopped based on a detected preliminary tremor, and a second step in which, when a door mechanism 15 is being opened, the door mechanism 15 is closed. Although the seismometer 60 is preferably installed in a housing 2, the seismometer 60 may be installed in a site of a factory. According to this embodiment, a preliminary tremor can be detected by the apparatus itself without receiving an emergency earthquake notice, and thus occurrence of an earthquake can be predicted. Thus, the wafers in the FOUP can be prevented from flying out of the FOUP, whereby breakage of the wafers can be prevented so as to minimize damage.

Although the embodiments of the present invention have been described in detail with reference to the drawings, the present invention is not limited thereto, and various changes and modifications can be made without departing from scope of the invention. For example, the system for limiting expansion of earthquake damage for use in the semiconductor manufacturing apparatus according to the present invention may includes: a reception part capable of receiving an emergency earthquake notice, which is delivered based on a preliminary tremor through a communication line; and a preliminary-tremor detection part capable of directly detecting a preliminary tremor, wherein the reception part and the preliminary-tremor detection part may optionally switched.

In the above embodiment, the heat processing apparatus (such as CVD apparatus) having a pressure-reducing pump is taken by way of example. However, the present invention may be applied to a heat processing apparatus (such as diffusion apparatus) which does not have a pressure-reducing pump. In this case, a plant exhaust system is used as an evacuation means of a heating furnace.

The invention claimed is:

1. A method for limiting expansion of earthquake damage for use in a semiconductor manufacturing apparatus that includes:

a transfer area in which a container, containing an object to be processed and having a lid, is loaded and unloaded;

a heating furnace for an object to be processed, the heating furnace having a furnace opening; and
a working area disposed below the heating furnace, the working area being separated from the transfer area by a partition wall having an opening, wherein:
the transfer area has a loading and unloading part for the container, a storage shelf part for the container, a transport part for the container when disposed near the opening, and a transfer mechanism configured to transfer the container; and
the working area has an elevating mechanism configured to load and unload a holder holding an object to be processed, the holder being placed on a lid member for opening and closing the furnace opening, and a door mechanism configured to open and close the opening of the partition wall and the lid of the container on the transport part,
the method for limiting expansion of earthquake damage comprising:
a step of receiving an emergency earthquake notice, which is delivered based on a preliminary tremor through a communication line, or of directly detecting a preliminary tremor;
a first step of stopping an operation of the heating furnace based on the received emergency earthquake notice or the detected preliminary tremor; and
a second step that is carried out simultaneously with the first step, in which, when the door mechanism is opened, the door mechanism is operated to be closed, wherein:
the semiconductor manufacturing apparatus further comprises a detection mechanism configured to detach the lid from the container on the loading and unloading part and to detect a position of an object to be processed in the container, and the second step includes the steps of, when the detecting mechanism is being operated, returning the detection mechanism to an initial state and closing the lid.

2. A method for limiting expansion of earthquake damage for use in a semiconductor manufacturing apparatus that includes:
a transfer area in which a container, containing an object to be processed and having a lid, is loaded and unloaded;
a heating furnace for an object to be processed, the heating furnace having a furnace opening; and
a working area disposed below the heating furnace, the working area being separated from the transfer area by a partition wall having an opening, wherein:
the transfer area has a loading and unloading part for the container, a storage shelf part for the container, a transport part for the container when disposed near the opening, and a transfer mechanism configured to transfer the container; and
the working area has an elevating mechanism configured to load and unload a holder holding an object to be processed, the holder being placed on a lid member for opening and closing the furnace opening, and a door mechanism configured to open and close the opening of the partition wall and the lid of the container on the transport part,
the method for limiting expansion of earthquake damage comprising:
a step of receiving an emergency earthquake notice, which is delivered based on a preliminary tremor through a communication line, or of directly detecting a preliminary tremor;
a first step of stopping an operation of the heating furnace based on the received emergency earthquake notice or the detected preliminary tremor; and
a second step that is carried out simultaneously with the first step, in which, when the door mechanism is opened, the door mechanism is operated to be closed, wherein:
the semiconductor manufacturing apparatus comprises an aligning mechanism configured to receive an object to be processed from the working area side, and to position a mark formed in a circumference of the object to be processed, and
the second step includes the step of operating a centering mechanism disposed on the aligning mechanism so as to restrain the object to be processed.

3. A system for limiting expansion of earthquake damage for use in a semiconductor manufacturing apparatus that includes:
a transfer area in which a container, containing an object to be processed and having a lid, is loaded and unloaded;
a heating furnace for an object to be processed, the heating furnace having a furnace opening; and
a working area disposed below the heating furnace, the working area being separated from the transfer area by a partition wall having an opening, wherein
the transfer area has a loading and unloading part for the container, a storage shelf part for the container, and a transport part for the container when disposed near the opening, and a transfer mechanism configured to transfer the container; and
the working area has an elevating mechanism configured to load and unload a holder holding an object to be processed, the holder being placed on a lid member for opening and closing the furnace opening, and a door mechanism configured to open and close the opening of the partition wall and the lid of the container on the transport part,
the system for limiting expansion of earthquake damage comprising:
a reception part configured to receive an emergency earthquake notice which is delivered based on a preliminary tremor through a communication line, or a preliminary-tremor detection part configured to directly detect a preliminary tremor; and
a control part configured to carry out a first step in which an operation of the heating furnace is stopped based on the received emergency earthquake notice or the detected preliminary tremor, and a second step in which, when the door mechanism is being opened, the door mechanism is operated to be closed, wherein
the semiconductor manufacturing apparatus further comprises a detection mechanism configured to detach the lid from the container on the loading and unloading part and to detect a position of an object to be processed in the container, and
the second step includes the steps of when the detecting mechanism is being operated, returning the detection mechanism to an initial state and closing the lid.

4. A system for limiting expansion of earthquake damage for use in a semiconductor manufacturing apparatus that includes:
a transfer area in which a container, containing an object to be processed and having a lid, is loaded and unloaded;
a heating furnace for an object to be processed, the heating furnace having a furnace opening; and
a working area disposed below the heating furnace, the working area being separated from the transfer area by a partition wall having an opening, wherein the transfer area has a loading and unloading part for the container, a storage shelf part for the container, and a transport part for the container when disposed near the opening, and a transfer mechanism configured to transfer the container; and the working area has an elevating mechanism configured to load and unload a holder holding an object to be processed, the holder being placed on a lid member for opening and closing the furnace opening, and a door mechanism configured to open and close the opening of the partition wall and the lid of the container on the transport part, the system for limiting expansion of earthquake damage comprising:

a reception part configured to receive an emergency earthquake notice which is delivered based on a preliminary tremor through a communication line, or a preliminary-tremor detection part configured to directly detect a preliminary tremor; and a control part configured to carry out a first step in which an operation of the heating furnace is stopped based on the received emergency earthquake notice or the detected preliminary tremor, and a second step in which, when the door mechanism is being opened, the door mechanism is operated to be closed, wherein the semiconductor manufacturing apparatus comprises an aligning mechanism configured to receive an object to be processed from the working area side, and to position a mark formed in a circumference of the object to be processed, and the second step includes the step of operating a centering mechanism disposed on the aligning mechanism so as to restrain the object to be processed.

* * * * *